United States Patent [19]
Kovalak et al.

[11] Patent Number: 6,164,571
[45] Date of Patent: Dec. 26, 2000

[54] RECOVERY OF PRECIOUS METALS FROM CIRCUIT BOARDS

[75] Inventors: Ronald Roy Kovalak, Canal Fulton; Lawrence Keith Hunt, Hudson, both of Ohio

[73] Assignee: The Goodyear Tire & rubber Company

[21] Appl. No.: 09/385,323

[22] Filed: Aug. 30, 1999

Related U.S. Application Data

[60] Provisional application No. 60/105,923, Oct. 28, 1998.

[51] Int. Cl.$^7$ .................................................. B02C 19/12
[52] U.S. Cl. ............................... 241/16; 241/17; 241/21; 241/23; 241/24.13; 241/29
[58] Field of Search ............................... 29/403.4; 241/21, 241/16, 17, 23, 29, 24.13, DIG. 38

[56] References Cited

U.S. PATENT DOCUMENTS

| | | | |
|---|---|---|---|
| 5,887,805 | 3/1999 | Chapman | 241/DIG. 38 |
| 5,891,926 | 4/1999 | Hunt et al. | |
| 5,979,033 | 11/1999 | Chang et al. | 241/DIG. 38 |

*Primary Examiner*—Mark Rosenbaum
*Attorney, Agent, or Firm*—Alvin T Rockhill

[57] ABSTRACT

This invention is based upon the unexpected discovery that the crosslinks in thermoset plastics can be broken by heating to a temperature of at least about 150° C. under a pressure of at least about $3.4 \times 10^6$ Pascals in the presence of 2-butanol. By utilizing the process of this invention, precious metals can be easily and economically recovered from electronic circuit boards. In this process, the crosslinks in the thermoset plastics in the circuit board break under conditions of heat and pressure in the presence of 2-butanol. After the crosslinks in the thermoset plastic break, the plastic material dissolves in the 2-butanol and can be removed by decanting. The remaining undissolved fiberglass mat and precious metal is removed by filtration, decanting or centrifugation. The precious metals which were entrapped in the thermoset plastic can be recovered from fiberglass on the circuit board by being melted. This invention more specifically discloses a process for recovering a precious metal which is entrapped in a thermoset plastic which comprises the steps of (1) heating the precious metal which is entrapped in the thermoset plastic to a temperature which is within the range of about 150° C. to about 300° C. under a pressure of at least about $3.4 \times 10^6$ Pascals in the presence of 2-butanol to break the crosslinks in the thermoset plastic to produce a slurry of uncrosslinked plastic material in the 2-butanol and (2) separating the precious metal from the slurry of the uncrosslinked plastic material in 2-butanol.

17 Claims, No Drawings

RECOVERY OF PRECIOUS METALS FROM CIRCUIT BOARDS

This application claims the benefit of U.S. Provisional Application 60/105,923 filed Oct.28, 1998.

BACKGROUND OF THE INVENTION

Circuit boards for electronic devices (such as, computers, radios, televisions sets, digital cameras and video recorders) contain significant amounts of precious metals including gold. After being damaged or becoming obsolete, the precious metals in such circuit boards can be recovered by utilizing a variety of conventional techniques. For instance, the circuit board can be treated with a strong acid to dissolve the precious metal which can subsequently be recovered by electroplating. However, this technique is expensive and slow.

The recycling of thermoset plastics and cured rubber products (such as, tires, hoses and belts) has proven to be an extremely challenging problem. This problem associated with recycling cured rubber products and thermoset plastics arises because the polymer becomes crosslinked during the curing or thermosetting process. After the polymer becomes thermoset, it cannot be reformed into other products. In other words, the cured or thermoset polymer cannot be melted and reformed into other products like metals or thermoplastic materials. Thus, cured rubber products and thermoset plastics cannot be simply melted and recycled into new products.

Since the discovery of the rubber vulcanization process by Charles Goodyear in the nineteenth century, there has been interest in the recycling of cured rubber. Millions of used tires, hoses, belts and other rubber products are discarded annually after they have been worn-out during their limited service life. These used rubber products are typically hauled to a dump because there is very little use for them after they have served their original intended purpose. A limited number of used tires are utilized in building retaining walls, as guards for protecting boats and similar things where resistance to weathering is desirable. However, a far greater number of tires, hoses and belts are simply discarded. A certain amount of cured rubber from tires and other rubber products is shredded or ground to a small particle size and incorporated into various products as a type of filler. For instance, ground rubber can be incorporated in small amounts into asphalt for surfacing roads or parking lots. Small particles of cured rubber can also be included in rubber formulations for new tires and other rubber products. However, it should be understood that the recycled rubber serves only in the capacity of a filler because it was previously cured and does not co-cure to an appreciable extent to the virgin rubber in the rubber formulation.

Various techniques for devulcanizing cured rubber have been developed. Devulcanization offers the advantage of rendering the rubber suitable for being reformulated and recurred into new rubber articles if it can be carried out without degradation of the rubber. In other words, the rubber could again be used for its original intended purpose. However, none of the devulcanization techniques previously developed have proven to be commercially viable.

U.S. Pat. No. 4,104,205 discloses a technique for devulcanizing sulfur-vulcanized elastomer containing polar groups which comprises applying a controlled dose of microwave energy of between 915 MHz and 2450 MHz and between 41 and 177 watt-hours per pound in an amount sufficient to sever substantially all carbon-sulfur and sulfur-sulfur bonds and insufficient to sever significant amounts of carbon-carbon bonds.

U.S. Pat. No. 5,284,625 discloses a continuous ultrasonic method for breaking the carbon-sulfur, sulfur-sulfur and, if desired, the carbon—carbon bonds in a vulcanized elastomer. Through the application of certain levels of ultrasonic amplitudes in the presence of pressure and optionally heat, it is reported that cured rubber can be broken down. Using this process, the rubber becomes soft, thereby enabling it to be reprocessed and reshaped in a manner similar to that employed with previously uncured elastomers.

U.S. Pat. No. 5,602,186 discloses a process for devulcanizing cured rubber by desulfurization, comprising the steps of: contacting rubber vulcanizate crumb with a solvent and an alkali metal to form a reaction mixture, heating the reaction mixture in the absence of oxygen and with mixing to a temperature sufficient to cause the alkali metal to react with sulfur in the rubber vulcanizate and maintaining the temperature below that at which thermal cracking of the rubber occurs, thereby devulcanizing the rubber vulcanizate. U.S. Pat. No. 5,602,186 indicates that it is preferred to control the temperature below about 300° C., or where thermal cracking of the rubber is initiated.

SUMMARY OF THE INVENTION

This invention is based upon the unexpected discovery that the crosslinks in thermoset plastics can be broken by heating to a temperature of at least about 150° C. under a pressure of at least about $3.4 \times 10^6$ Pascals in the presence of 2-butanol. By utilizing the process of this invention, precious metals can be easily and economically recovered from electronic circuit boards. This technique does not require the use of microwaves, ultrasonic waves, an alkali metal or a strong acid. In this process, the crosslinks in the thermoset plastics in the circuit board break under conditions of heat and pressure in the presence of 2-butanol. After the crosslinks in the thermoset plastic break, the plastic material dissolves in the 2-butanol and can be removed by extraction. After removal of the plastic material by extraction, the precious metals which were entrapped in the thermoset plastic can be recovered from fiber glass on the circuit board by filtration or other means with the precious metal being melted for recovery.

This invention more specifically discloses a process for recovering a precious metal which is entrapped in a thermoset plastic which comprises the steps of (1) heating the precious metal which is entrapped in the thermoset plastic to a temperature which is within the range of about 150° C. to about 300° C. under a pressure of at least about $3.4 \times 10^6$ Pascals in the presence of 2-butanol to break the crosslinks in the thermoset plastic to produce a slurry of uncrosslinked plastic material in the 2-butanol and (2) separating the precious metal from the slurry of the uncrosslinked plastic material in 2-butanol.

This invention also reveals a process for recovering a precious metal which is entrapped in a thermoset plastic on an electronic circuit board having a fiberglass board, which comprises the steps of (1) heating the circuit board to a temperature which is within the range of about 150° C. to about 300° C. under a pressure of at least about $3.4 \times 10^6$ Pascals in the presence of 2-butanol to break the crosslinks in the thermoset plastic to produce a slurry of uncrosslinked plastic material in the 2-butanol, (2) separating the slurry of the uncrosslinked plastic material in 2-butanol from the precious metal and the fiberglass board, (3) heating the precious metal and the fiberglass board to a temperature which is above the melting point of the precious metal, (4) removing the precious metal from the fiberglass board while the precious metal is in the molten state and (5) cooling the precious metal to below its melting point to recover it from the electronic circuit board.

DETAILED DESCRIPTION OF THE INVENTION

The recovery process of this invention can be carried out by simply heating a precious metal that is entrapped in a thermoset plastic in the presence of 2-butanol to a temperature of at least about 150° C. under a pressure of at least about $3.4 \times 10^6$ Pascals (Pa). It is normally preferred for the temperature to be no more than about 300° C. to minimize the level of polymer degradation. In other words, if the process is conducted at a temperature of no more than about 300° C., the crosslinks in the cured rubber can be broken preferentially to the carbon-carbon bonds in the polymer. Thus, by carrying out the process at a temperature of 300° C. or less, the molecular weight of the plastic can be maintained at a high level. For this reason, the process will typically be conducted at a temperature which is within the range of about 150° C. to about 300° C.

It is normally preferred for the process to be carried out at a temperature which is within the range of about 200° C. to about 280° C. The most preferred temperatures are within the range of about 230° C. to about 260° C. The pressure employed will typically be within the range of about $3.4 \times 10^6$ Pascals (500 lbs/in$^2$) to about $3.4 \times 10^7$ Pascals (5000 lbs/in$^2$). It is normally preferred to utilize a pressure which is within the range of about $6.9 \times 10^6$ Pascals (1000 lbs/in$^2$) to about $2.8 \times 10^7$ Pascals (4000 lbs/in$^2$). It is generally most preferred to utilize a pressure which is within the range of about $1.7 \times 10^7$ Pascals (2500 lbs/in$^2$) to about $2.4 \times 10^7$ Pascals (3500 lbs/in$^2$). It is normally preferred for the precious metal that is entrapped in the thermoplastic to be emersed in a bath of 2-butanol. In any case, it is important to protect the polymer from oxygen during the process if there is a desire to recycle the plastic. In some cases, it will be desirable to conduct the process under an inert gas atmosphere such as nitrogen.

After the crosslinks in the plastic material have been broken, the plastic material can be separated from the 2-butanol and recycled. Since the uncrosslinked plastic material is somewhat soluble in the 2-butanol at elevated temperatures, the separation will typically be carried out at a temperature of less than about 100° C. The uncrosslinked plastic material can be recovered from the 2-butanol utilizing conventional techniques for separating solids from liquids. For instance, the uncrosslinked plastic material can be recovered from the 2-butanol and other solid residue (such as, fiberglass and the precious metal) by decantation, filtration, centrification and the like.

In the case of recovery of precious metals (such as gold) from electronic circuit boards, it will also be necessary to subsequently recover the precious metal from the fiberglass of the board. This can be accomplished by simply heating the precious metal and the fiberglass to a temperature above the melting point of the precious metal (above 1065° C. in the case of gold). Then, the precious metal in molten form can be separated from the solid fiberglass and any other solid materials that remain. The molten metal is subsequently cooled to below its melting point and recovered.

This invention is illustrated by the following examples which are merely for the purpose of illustration and are not to be regarded as limiting the scope of the invention or the manner in which it can be practiced. Unless specifically indicated otherwise, parts and percentages are given by weight.

EXAMPLE 1

Gold can be recovered from electronic circuit boards which are comprised of fiberglass, epoxy resins and precious metals by utilizing this procedure. The circuit boards can be crushed into relatively small pieces to facilitate the recovery process. The small pieces of the crushed circuit boards are then mixed into 2-butanol and heated to a temperature of 300° C. at pressure of $2.1 \times 10^7$ Pascals (3000 lbs/in$^2$) for a period of about 30 minutes to break the crosslinks in thermoset plastics in the circuit board. The slurry of uncrosslinked plastic material in 2-butanol formed is then removed from solid materials including the gold and fiberglass.

The solid materials are then heated to a temperature of about 1100° C. to melt the gold. The molten gold is then poured off of the remaining solid material and the gold is recovered by cooling it to below its melting point. The plastic material can also be recovered from the slurry and recycled.

Variations in the present invention are possible in light of the description of it provided herein. While certain representative embodiments and details have been shown for the purpose of illustrating the subject invention, it will be apparent to those skilled in this art that various changes and modifications can be made therein without departing from the scope of the subject invention. It is, therefore, to be understood that changes can be made in the particular embodiments described which will be within the full intended scope of the invention as defined by the following appended claims.

What is claimed is:

1. A process for recovering a precious metal which is entrapped in a thermoset plastic which comprises the steps of (1) heating the precious metal which is entrapped in the thermoset plastic to a temperature which is within the range of about 150° C. to about 300° C. under a pressure of at least about $3.4 \times 10^6$ Pascals in the presence of 2-butanol to break the crosslinks in the thermoset plastic to produce a slurry of uncrosslinked plastic material in the 2-butanol and (2) separating the precious metal from the slurry of the uncrosslinked plastic material in 2-butanol.

2. A process as specified in claim 1 wherein step (1) is carried out at a pressure which is within the range of about $3.4 \times 10^6$ Pascals to about $3.4 \times 10^7$ Pascals.

3. A process as specified in claim 2 wherein step (1) is carried out at a temperature which is within the range of about 200° C. to about 280° C.

4. A process as specified in claim 3 wherein step (1) is carried out at a pressure which is within the range of about $6.9 \times 10^6$ Pascals to about $2.8 \times 10^7$ Pascals.

5. A process as specified in claim 4 wherein step (1) is carried out at a temperature which is within the range of about 230° C. to about 260° C.

6. A process as specified in claim 5 wherein step (1) is carried out at a pressure which is within the range of about $1.7 \times 10^7$ Pascals to about $2.4 \times 10^7$ Pascals.

7. A process as specified in claim 6 wherein the precious metal is gold.

8. A process as specified in claim 2 wherein the thermoset plastic is an epoxy resin.

9. A process for recovering a precious metal which is entrapped in a thermoset plastic on an electronic circuit board having a fiberglass board, which comprises the steps of (1) heating the circuit board to a temperature which is within the range of about 150° C. to about 300° C. under a pressure of at least about $3.4 \times 10^6$ Pascals in the presence of 2-butanol to break the crosslinks in the thermoset plastic to produce a slurry of uncrosslinked plastic material in the 2-butanol, (2) separating the slurry of the uncrosslinked plastic material in 2-butanol from the precious metal and the fiberglass board, (3) heating the precious metal and the fiberglass board to a temperature which is above the melting point of the precious metal, (4) removing the precious metal from the fiberglass board while the precious metal is in the molten state and (5) cooling the precious metal to below its melting point to recover it from the electronic circuit board.

10. A process as specified in claim 9 which further comprised crushing the circuit board into small pieces prior to step (1).

11. A process as specified in claim 10 wherein step (1) is carried out at a pressure which is within the range of about $3.4 \times 10^6$ Pascals to about $3.4 \times 10^7$ Pascals.

12. A process as specified in claim 11 wherein step (1) is carried out at a temperature which is within the range of about 200° C. to about 280° C.

13. A process as specified in claim 12 wherein step (1) is carried out at a pressure which is within the range of about $6.9 \times 10^6$ Pascals to about $2.8 \times 10^7$ Pascals.

14. A process as specified in claim 13 wherein step (1) is carried out at a temperature which is within the range of about 230° C. to about 260° C.

15. A process as specified in claim 14 wherein step (1) is carried out at a pressure which is within the range of about $1.7 \times 10^7$ Pascals to about $2.4 \times 10^7$ Pascals.

16. A process as specified in claim 14 wherein the precious metal is gold.

17. A process as specified in claim 16 wherein the thermoset plastic is an epoxy resin.

* * * * *